United States Patent [19]

Dixon

[11] Patent Number: 5,234,351
[45] Date of Patent: Aug. 10, 1993

[54] MEMORY CARD HOLDER AND EJECTION MECHANISM

[75] Inventor: Dirk R. Dixon, Elizabethtown, Pa.

[73] Assignee: The Whitaker Corporation, Wilmington, Del.

[21] Appl. No.: 986,177

[22] Filed: Dec. 7, 1992

[51] Int. Cl.$^5$ ............................................. H01R 13/62
[52] U.S. Cl. ..................................... 439/160; 439/152
[58] Field of Search .................................. 439/152–160, 439/372

[56] References Cited

U.S. PATENT DOCUMENTS

| | | | |
|---|---|---|---|
| 4,836,789 | 6/1989 | Rudy, Jr. et al. | 439/64 |
| 4,888,549 | 12/1989 | Wilson et al. | 324/73 R |
| 4,941,841 | 7/1990 | Darden et al. | 439/377 |
| 5,033,972 | 7/1991 | Komatsu | 439/153 |
| 5,149,276 | 9/1992 | Dixon | 439/159 |

FOREIGN PATENT DOCUMENTS 0166476  6/1989  Japan ................................. 439/157

OTHER PUBLICATIONS

"PCMCIA Memory Cards ... Type I? ... Type II? ... Type III?" By: Art Lesh Sep. 1992 *Terminator*.

*Primary Examiner*—David L. Pirlot
*Attorney, Agent, or Firm*—William B. Noll

[57] ABSTRACT

This invention is directed to a memory card ejection mechanism, where the card is electrically connected to a mating header, as known in the art. The mechanism comprises a memory card holder consisting of a pair of channel-shaped side rails for slidably receiving the memory card therebetween, where the rails extend between a closed mating header end and an open memory card receiving end. Each rail is defined by an outer wall, an inwardly directed upper wall, and an inwardly directed lower wall, and the joint or intersection between the outer wall and the inwardly directed upper wall is characterized by a recess extending a predetermined distance along the joint. The mechanism further includes a memory card ejector plate for slidably engaging the holder and consists of a base and a pair of upstanding side walls, where the base extends between a mating header end and a card receiving end. The mating header end includes a pair of upstanding tabs adapted to engage the header proximate end of the memory card when received between the side rails. The card receiving end includes a pull tab extending in a direction away from the side walls, whereby each said wall, along an upper edge thereof, is provided with an inwardly directed flange adapted to be slidably received within a corresponding recess along the rail, and the length of the flange is less than the said predetermined distance to allow relative movement between the holder and the ejector plate.

3 Claims, 3 Drawing Sheets

MEMORY CARD HOLDER AND EJECTION MECHANISM

BACKGROUND OF THE INVENTION

This invention is directed to a modular unit for use with electronic equipment, such as computers, where such unit is adapted to receive a memory card to be electrically interconnected to such equipment, but which must be capable of being readily disconnected therefrom.

By way of brief background, with the growth of data collection, storage and retrieval of information, memory card technology has grown significantly. At the present time, there are three different memory card types, as defined by the Personal Computer Memory Card International Association (PCMCIA). This is the standards body responsible for developing the 68-pin memory card standard. The three memory card types, as illustrated in FIGS. 2 and 3, are as follows:

a. Type I Memory Cards are the same width and length as a common credit card, 54 mm×85.6 mm, but are thicker than a credit card. The thickness of a Type I card is 3.3 mm (0.130").

b. Type II Memory Cards are used by those companies which are utilizing memory components that are too high to be housed within a Type I card. Type II memory cards are also the same overall length and width as credit cards, but have a raised body cross section in the substrate area which gives them an overall thickness of 5 mm (0.195"). The raised substrate areas of these cards are 48 mm in width.

c. Type III Memory Cards are the result of a recent movement sponsored by the Small Form Factor Committee (SFF) to enable 1.8" Small Form Factor Disk Drives to be plugged into memory card connectors in small portable computer applications. Type III memory cards are the same length and width as Type I and Type II memory cards, However, Type III cards have a substrate area thickness of 10.5 mm. Also, Type III memory cards require a card guide opening width of 51 mm on the header connector to accommodate the slightly wider raised substrate area.

One of the desirable features of a memory card holder is its ability to accommodate all of the presently known and used memory cards. Further, to be able to do same with a simplified holder is even more preferred.

Typical prior art memory card holders have relied upon complex moving parts and/or levers to effect removal of the memory card. For example, U.S. Pat. No. 4,836,790 discloses a header device having means for ejecting a memory card which includes a pair of first levers that abut an end portion of the memory card and a pair of second levers located outside the holder which when rotated cause movement of the first levers to pull the memory card from the header. U.S. Pat. No. 4,640,545 also discloses a lever mechanism attached to the header for ejecting the memory card. Further, U.S. Pat. No. 5,011,420 discloses a card holder having an ejection mechanism which includes a U-shape member that wraps around the mating end of the card and is attached to a lever mechanism on the card holder. Upon activating the lever, the U-shape member pulls against the end of the memory card to eject it from the holder. Another eject mechanism within the card holder is also disclosed in U.S. Pat. No. 5,033,972.

The present invention provides for a holder mechanism which eliminates the lever devices of the prior art, while providing a holder which can accept the several types of memory cards.

SUMMARY OF THE INVENTION

This invention relates to a memory card ejection mechanism, where, as known in the art, the memory card is electrically connected to a mating header, which in turn is electrically connected to an electronic device, such as a computer. The memory card mechanism consists of a pair of channel-shaped side rails for slidably receiving the memory card therebetween, where the rails extend between a closed mating header end and an open memory card receiving end. Each rail is defined by an outer wall, an inwardly directed upper wall, and an inwardly directed lower wall, and the joint between the outer wall and its corresponding inwardly directed upper wall is characterized by a recess extending a predetermined distance along the joint. Additionally, a memory card ejector plate is provided for slidably engaging the holder and consists of a base and a pair of upstanding side walls. The base extends between a mating header end and a card receiving end, and the mating header end includes a pair of upstanding tabs adapted to engage the header proximate end of the memory card when received between the side rails. The card receiving end includes a pull tab extending in a direction away from the side walls, and each side wall, along an upper edge thereof, is provided with an inwardly directed flange adapted to be slidably received within a corresponding recess along the rail. The length of the flange is less than the above noted predetermined distance to allow relative movement between the holder and the ejector plate.

DETAILED DESCRIPTION OF PREFERRED EMBODIMENT

Figure 1:
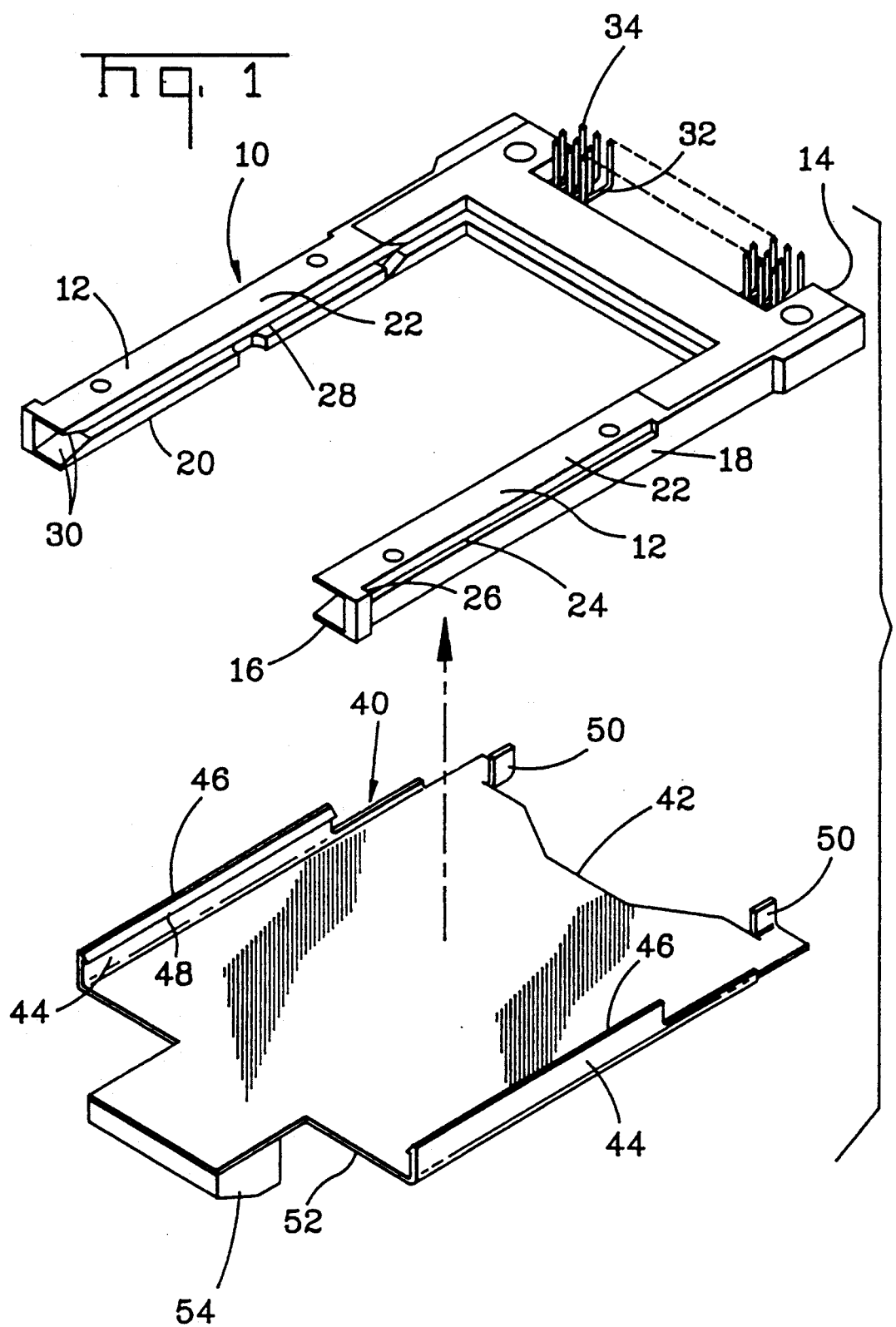
FIG. 1 is an exploded perspective view of the memory card ejection mechanism according to this invention.

Referring first to FIG. 1, the invention hereof relates to a memory card ejection mechanism. Such mechanism includes a modular card holder 10 having a pair of parallel side rails 12 extending between a closed mating header end 14 and an open memory card receiving end 16. Each said side rail 12 is channel-shaped and defined by an upstanding side wall 18, an inwardly directed lower wall 20, and an inwardly directed upper wall 22. At the intersection or joint 24 between the upstanding side wall 18 and upper wall 22, a recess 26 of a predetermined length is provided. The function thereof will become more apparent hereinafter.

The memory card receiving channel 28, as defined by the three walls 18, 20, 22, includes converging ramps 30, at the card receiving end 16, to align and direct the memory card toward the closed mating header end 14. The mating header or connector 32, as known in the art, is partially illustrated in FIG. 1 by the contact pins 34 and dotted lines. Such connector typically includes contact pins 34 for electrically interconnecting to electronic equipment, such as a computer. Though not shown in FIG. 1, the connector 32 further includes terminals projecting toward the memory card to be mated therewith, as known in the art.

Disposed below the modular card holder 10, and exploded therefrom, is card ejector plate 40. The plate 40, molded from plastic or stainless steel, comprises a base 42 and a pair of upstanding side walls 44, where the upper edge 46 of each side wall 44 includes an inwardly directed flange 48. The length thereof is less than the recess 26 to allow for a sliding action between the plate 40 and modular card holder 10. The plate 40 is dimensioned to engage the modular card holder 10 by having the side walls 44 lie contiguous with the side walls 18 such that the flanges 48 snap into their corresponding recesses 26. By this arrangement, the card holder 10 and plate 40 are held together. However, by virtue of the relative length of the flanges 48 to the recesses 26, a sliding action therebetween is found.

Figure 2:
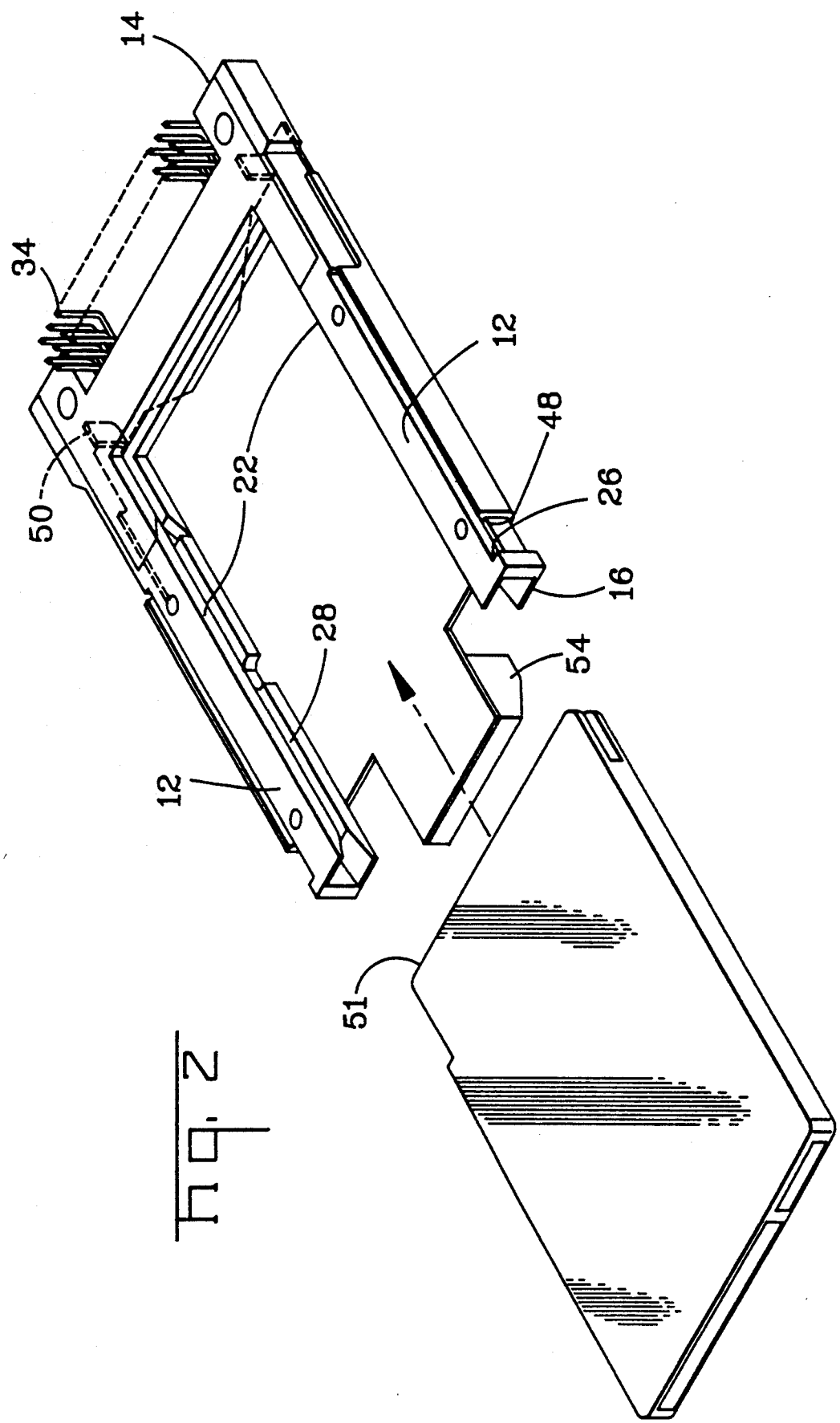
FIG. 2 is a perspective view of the assembled memory card ejection mechanism of FIG. 1, and a positioned memory card (Type I) prior to entry into such mechanism.
Figure 3:
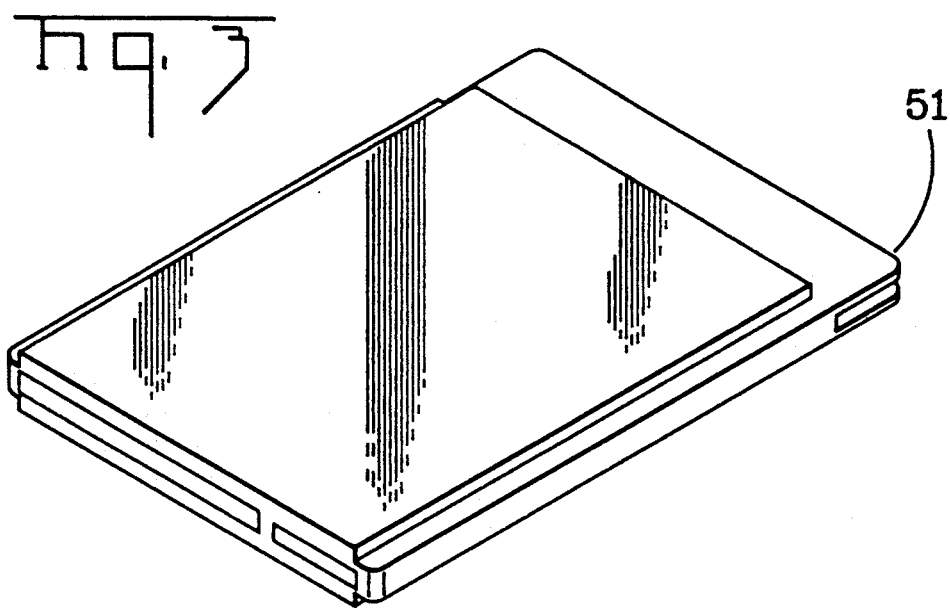
FIG. 3 is a perspective view of a Type II memory card, for use herein.
Figure 4:
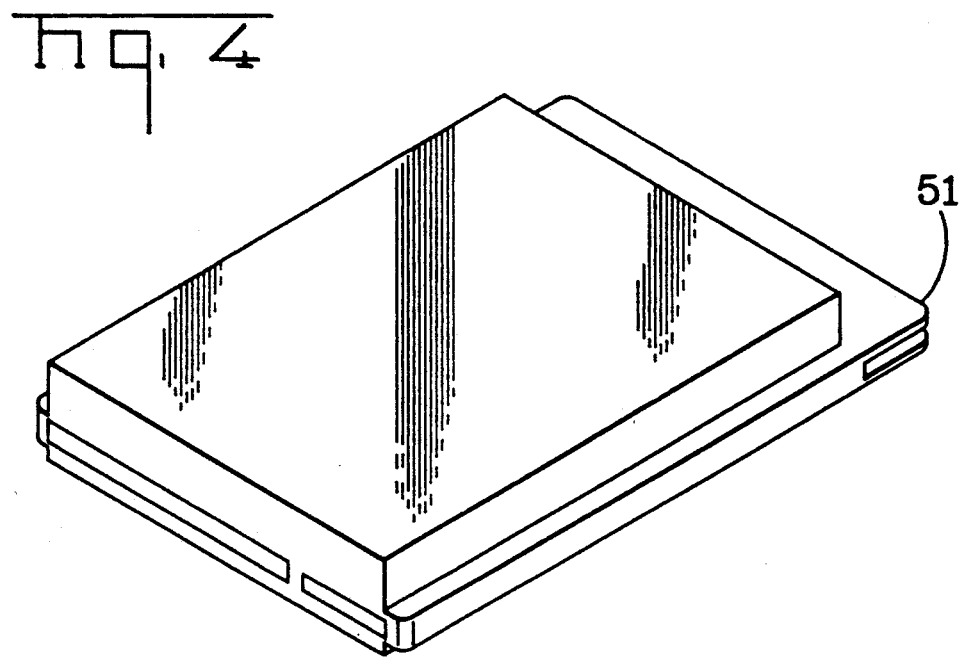
FIG. 4 is a perspective view, similar to FIG. 3, but showing a Type III memory card.

At the mating header end 14, a pair of upstanding tabs 50 are provided to contact the card edge 51, see FIGS. 2–4, and to provide pressure thereagainst in the removal of the memory card from the mechanism.

The opposite end 52, or card entry end, is provided with a pull tab 54 projecting downwardly. By simply pulling on such a tab, it is possible to release the memory card from the connector 32 thereby making the card accessible for manual removal, as desired.

FIG. 2 illustrates the mating relationship of the modular card holder 10 and the ejector plate 40. In this position, the memory card, Type I shown in FIG. 2, may be inserted therein between side rails 12. Due to the spaced relationship of the upper walls 22, and the configurations of the Type II and III cards illustrated in FIGS. 3 and 4, respectively, the card ejector mechanism of this invention may be used with each of the current memory cards. That is, the lateral dimension of the raised center portion of the latter two cards is less than the spacing between the upper walls 22.

I claim:

1. A memory card ejection mechanism, where said card is electrically connected to a mating header, said mechanism comprising:
   a. a memory card holder consisting of a pair of channel-shaped side rails for slidably receiving said memory card therebetween, said rails extending between a closed mating header end and an open memory card receiving end, where each said rail is defined by an outer wall, an inwardly directed upper wall, and an inwardly directed lower wall, and a joint between said outer wall and said inwardly directed upper wall is characterized by a recess extending a predetermined distance along said joint, and
   b. a memory card ejector plate for slidably engaging said holder and consisting of a base and a pair of upstanding side walls, where said base extends between a mating header end and a card receiving end, said mating header end including a pair of upstanding tabs adapted to engage the header-proximate end of said memory card when received between said side rails, and said card receiving end including a pull tab extending in a direction away from said side walls, whereby each said side wall, along an upper edge thereof, is provided with an inwardly directed flange adapted to be slidably received within a corresponding said recess along said rail, the length of said flange being less than said predetermined distance to allow relative movement between said holder and said ejector plate.

2. The memory card ejection mechanism according to claim 1, wherein said rails include converging ramps at the open memory card end for directing and aligning the memory card therebetween.

3. The memory card ejection mechanism according to claim 1, wherein the upstanding side walls of the ejector plate are in sliding engagement with the outer wall of the memory card holder.

* * * * *